US009228701B2

(12) United States Patent
Eggleton et al.

(10) Patent No.: US 9,228,701 B2
(45) Date of Patent: Jan. 5, 2016

(54) ILLUMINATED STRIPE AND ILLUMINATED STRIPE SYSTEM

(75) Inventors: Richard Eggleton, Vantaa (FI); Temmo Pitkänen, Espoo (FI)

(73) Assignee: MARIMILS OY, Vantaa (FI)

( * ) Notice: Subject to any disclaimer, the term of this patent is extended or adjusted under 35 U.S.C. 154(b) by 113 days.

(21) Appl. No.: 14/110,845

(22) PCT Filed: Apr. 18, 2012

(86) PCT No.: PCT/FI2012/050380
§ 371 (c)(1),
(2), (4) Date: Oct. 9, 2013

(87) PCT Pub. No.: WO2012/143611
PCT Pub. Date: Oct. 26, 2012

(65) Prior Publication Data
US 2014/0036500 A1  Feb. 6, 2014

(30) Foreign Application Priority Data

Apr. 18, 2011 (FI) ..................................... 20115370
Apr. 18, 2011 (FI) ..................................... 20115371

(51) Int. Cl.
| | | |
|---|---|---|
| F21V 1/00 | (2006.01) |
| F21K 99/00 | (2010.01) |
| F21S 4/00 | (2006.01) |
| H01L 25/075 | (2006.01) |
| F21V 31/00 | (2006.01) |
| F21V 9/16 | (2006.01) |
| F21V 15/01 | (2006.01) |
| F21V 23/04 | (2006.01) |
| F21V 29/87 | (2015.01) |
| F21Y 101/02 | (2006.01) |
| F21Y 103/00 | (2006.01) |

H01L 33/56 (2010.01)
(Continued)

(52) U.S. Cl.
CPC . *F21K 9/50* (2013.01); *F21S 4/006* (2013.01); *F21V 9/16* (2013.01); *F21V 15/01* (2013.01); *F21V 23/0435* (2013.01); *F21V 29/87* (2015.01); *F21V 31/00* (2013.01); *H01L 25/0753* (2013.01); *F21Y 2101/02* (2013.01); *F21Y 2103/003* (2013.01); *G08B 7/066* (2013.01); *H01L 33/56* (2013.01); *H01L 33/64* (2013.01); *H01L 2924/0002* (2013.01)

(58) Field of Classification Search
CPC .......... F21V 15/01; F21V 31/00; F21V 9/16; F21S 4/00; F21Y 2101/02
USPC .......................... 362/235, 217.01, 84, 249.02
See application file for complete search history.

(56) References Cited

U.S. PATENT DOCUMENTS 6,866,394 B1   3/2005 Hutchins et al.
8,111,022 B2 *  2/2012 Snijder et al. ................. 315/312
(Continued)

FOREIGN PATENT DOCUMENTS

CN  201053599 Y  4/2008
CN  201066055 Y  5/2008
(Continued)

*Primary Examiner* — Ali Alavi
(74) *Attorney, Agent, or Firm* — Birch, Stewart, Kolasch & Birch, LLP

(57) ABSTRACT

An illuminated stripe includes light-emitting light sources and a member for conducting current to the light sources and a casing part. The light sources and/or the member for conducting current to the light sources are at least in part surrounded with the casing part. At least a part of the casing part includes a first substance, and at least a part of the casing part includes a second substance.

25 Claims, 3 Drawing Sheets

(51) Int. Cl.
*H01L 33/64* (2010.01)
*G08B 7/06* (2006.01)

(56) References Cited

U.S. PATENT DOCUMENTS

2005/0242711 A1* 11/2005 Bloomfield .................. 313/502
2008/0074871 A1* 3/2008 Meis et al. .................... 362/218
2010/0165600 A1* 7/2010 Ku ................................. 362/84

FOREIGN PATENT DOCUMENTS

| WO | WO 98/23896 A1 | 6/1998 |
| WO | WO 2011/029998 A1 | 3/2011 |
| WO | WO 2011/110217 A1 | 9/2011 |

* cited by examiner

ILLUMINATED STRIPE AND ILLUMINATED STRIPE SYSTEM

The invention relates to illuminated stripes and to illuminated stripe systems and method of production of illuminated stripe systems.

BACKGROUND OF THE INVENTION

Different systems for guiding people in situations of danger and accident, such as in fire situations, to the emergency exits of different buildings, tunnels or vessels are known in the art. These are various visual ways to mark the desired routes, such as lightings of emergency exit routes, or otherwise, e.g. emergency exit routes marked with reflective paint or tape.

One prior-art illuminated stripe is presented in publication FI108106B. It presents a conductor element, which comprises at least an electrically-conductive elongated conductor part, to which a number of components that are consecutive to each other in the longitudinal direction are fixed, e.g. elements that bring about a lighting function or corresponding. The conductor part and the components are surrounded with a casing part.

The distinguishing of stripes in situations of danger and accident is a problem because the lighting of the stripes typically requires electric current and it would be important to distinguish a stripe also in situations in which electric current is not available for some reason.

Prior-art solutions also include phosphorized stripes. The phosphorized surface radiates light also afterwards, when it is not in the light. This phenomenon is known as phosphorescence. In the phenomenon, a phosphorescent material absorbs electromagnet radiation and emits lower-energy radiation. A phosphorized surface thus emits radiation with a delay, i.e. a surface exposed to visible light incandesces light also in the dark.

In prior-art solutions, phosphorized stripes absorb light into themselves from sunlight or from lighting that is separate and distant from the stripe. This light is often not sufficient to illuminate the phosphorized surface adequately enough for the phosphorized surface to illuminate the stripe brightly enough for long enough in dark conditions.

In many applications, such as in hotels, passenger ships or tunnels, there are specified emergency exits in emergency situations, which exits people should follow in evacuation circumstances. On the other hand, in a fire situation a predefined emergency exit may be impossible owing to the location of the fire, in which case prior-art solutions might direct in the wrong direction or even towards the fire. The stripe markings known in the art that are coated with a phosphorized substance are only static stripes, and a dynamic control that is distinguished from the static stripe cannot be connected to them. Prior-art stripes containing a surface coated with a phosphorized substance do not either function in the type of dark places, in which there is no other lighting, such as e.g. in dark tunnels. Also production of coated stripe markings or stripes that contain surfaces coated with phosphorized substance is complex and costly and the robustness of the coating doesn't always fulfil all requirements.

The most recent illuminated stripes can use high-bright LEDs. These kind of LEDs offer high brightness and luminosity but at the same time they create lot of heat. The heat production of the light sources of the prior art solutions degrades reliability, durability and luminosity of the light sources. Also excess heat that is generated in the casing part and not transferred away from the light sources or other components, can damage or affect not only the properties of the light sources but also properties of the casing part so that the effective luminosity of the illuminated stripe is degraded. Light stripes can also have other components inside the casing part and also these components can suffer from too high temperatures.

BRIEF DESCRIPTION OF THE INVENTION

The aim of the invention is to achieve a new type of solution, by means of which the problems of prior art can be avoided. The invention is an illuminated stripe comprising light emitting light sources, means for conducting current to the light sources and casing part which surrounds the light sources and/or means for conducting current to light sources. The casing part contains first substance and second substance.

The casing part of the illuminated stripe can be implemented e.g. by introducing particles of first substance and second substance to the casing part material. In more detail the illuminated stripe can also comprise at least an elongated and essentially flat electricity conductive conductor part, such as a band, a stripe or a like, in which several electric components, such as probes, LEDs, resistors and/or the like bringing out the lighting operation or like according to the use of the conducting element, are being attached to one after another in the longitudinal direction.

The present invention is also a method for production of illuminated stripes, wherein illuminated stripe is being produced by attaching the components to the conductor part, arranging the conductor part and existing components therewith when viewed in a cross section totally surrounded by a casing material forming the said casing part, by exploiting a continuous production process, such as extrusion or like. First and/or second substance can be added to casing material before the continuous production process, e.g. extrusion or during the production process. The first and/or second substance, e.g. particles or dye can be essentially evenly distributed to the casing part or they can be located at certain part of the casing part.

In one embodiment of the invention first substance is a substance which transfers heat away from the light sources or other components and second substance is a substance which stores light, and it can be illuminated with the light sources. In this embodiment the casing part of the illuminated stripe can be implemented e.g. by introducing particles of heat transferring substance, e.g. particles which have essentially high thermal conductivity, and/or particles of light storing substance, e.g. photoluminescent substance to the casing part material. The heat transferring substance and/or light storing substance, e.g. particles or dye, can be essentially evenly distributed to the casing part or they can be located at certain part of the casing part.

In one embodiment of the invention the first substance has differing optical qualities than the second substance. For example the first substance can have diffractive material and second substance can have reflective material. Also for example the first substance may have another color than the second substance.

In one embodiment of the invention the light of the light sources is distinguished from the rest of the stripe. The stripes according to the present invention may be stripes with static light sources, stripes which enable dynamic usage of light sources or stripes that enable static and dynamic usage of light sources. By means of distinguishable light sources in one embodiment of the invention, an illuminated stripe provided with a light-storing substance and dynamically controllable light sources can be made to guide also dynamically, i.e. to create an impression of movement can be brought about with it, regardless of the light-storing property of the illuminated stripe.

The solution of the invention has many important advantages. In the solution of the invention, the casing part of the illuminated stripe is no longer used only as a protective structure but it has further capabilities. The further capabilities are be introduced to the illuminated stripe by including first substance and second substance to the casing part. These capabilities can be added to the stripe of the present invention in such a way that the structure of the stripe can be kept simple and robust. These capabilities can enable certain functions or change the visual appearance of the illuminated stripe, e.g. for guiding or decorative use. The most essential benefits of the method of production of the invention include its simplicity and operating reliability, which enables significantly more profitable production when compared to prior art methods. Also production of the illuminated stripe according to this invention is less complex than with the prior art methods because there are no adhesion problems and no need for additional painting process or extra elements to be attached to the illuminated stripe.

The solution according to the embodiment where first substance is heat transferring substance and second substance is light storing substance has also many important advantages. The heat transferring substance is able to transfer the heat produced by the light sources away from the light sources, other components and light stripe. This way the durability, reliability and luminosity of the light sources can be improved over the prior art solutions. Also the properties of the casing part can be maintained better at original level when heat is transferred away from the light sources and components and no excess heat is present in the casing part. This creates benefits especially when using high bright LEDs or other light sources or elements that create heat.

The most essential benefits of the method of production of this embodiment is less complex than with the prior art methods because there are no adhesion problems and no need for additional painting process or rigid heat transferring elements to be attached to the illuminated stripe. Rigid heat transferring elements would not enable the stripe to be flexible as is the case in the solution with heat transferring substance which consists of e.g. particles.

Advantage of an embodiment where second substance is light storing substance is that by means of substance that stores light in the material of the casing part, the illuminated stripe is illuminated also for a certain time after the light sources do not emit light, e.g. owing to an electrical outage, because the casing part of the illuminated stripe which contains a light-storing substance is illuminated with the light sources that are near and in connection with the illuminated stripe when the electric current is in use. In this case the stripe is illuminated better than in prior-art solutions and because the illuminated stripe can be illuminated more effectively and for longer after the extinguishing of the light sources than in prior-art phosphorized stripes or in stripes that are illuminated only by means of an electric current. This is of great advantage in the dark, e.g. in emergency exit routes and this way normal lights are not needed to illuminate the stripe. Another benefit is that the stripe according to this invention needs to pass only photoluminescent approvals and not electric system approvals because the stripe is illuminated also without electricity, Because of this also no battery backed up power supplies are needed and this reduces costs when comparing to the prior art solutions.

BRIEF DESCRIPTION OF THE FIGURES

In the following, the invention will be described in detail by the aid of some examples of its embodiments with reference to the attached drawings, wherein.

DETAILED DESCRIPTION OF THE INVENTION

Figure 1:
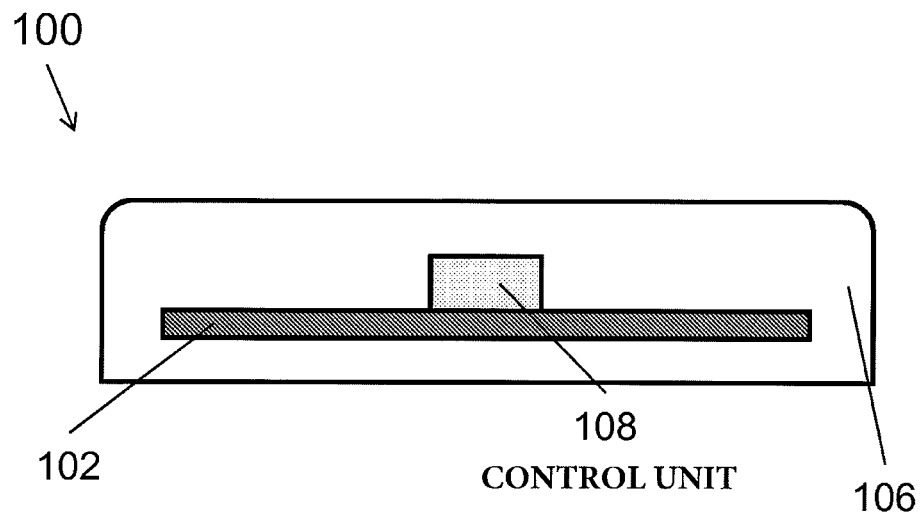
FIG. 1 presents a cross-section of an example embodiment of illuminated stripe according to the invention which contains first and second substance.

FIG. 1 presents a cross-section of an example embodiment of an illuminated stripe according to the invention. The illuminated stripe 100 comprises a circuit board 102, to which light sources 108 are connected. An elastic and thin circuit board can be used as the circuit board 102. The light sources 108 can be semiconductor light sources, e.g. LED light sources. The light sources can be LEDs which can be single colour LEDs, e.g. red-, blue-, green-, yellow-, white- or ultra violet (UV)-LEDs or RGB-LEDs, which can provide multiple colours in a single LED light source. The circuit board 102 and the light sources 108 are fitted inside a one-piece casing part 106. Since the casing part 106 is one-piece, the structure of the illuminated stripe 100 is waterproof. Plastic such as PVC, polyurethane, olefin and/or like or some other corresponding material can be used as the material of the casing part 106. The material of the casing part also 106 comprises first and second substance. The first substance can contain light-storing material and/or second substance can contain heat transferring material. The casing part containing light storing and heat transferring substance absorbs heat created by the light sources 108 away from the light sources 108 with heat transferring substance and absorbs the light emitted into to casing by light storing substance. After this, the casing part 108 containing a light-storing substance emits light. The heat transferring substance can be e.g. particles of heat transferring material and the light storing substance can be e.g. particles of light storing material or dye of light storing material.

In another embodiment of the invention the casing part 106 of the illuminated stripe can be e.g. a tube or sleeve or other type of casing structure and it can be formed from one or more parts.

Figure 2:
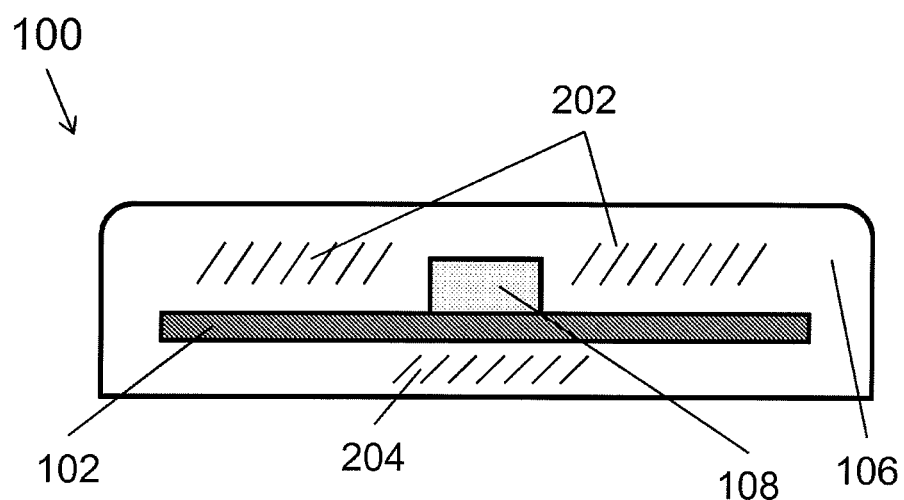
FIG. 2 presents a cross-section of an example embodiment of illuminated stripe according to the invention, which contains first and second substance at certain areas of the casing part.

The first and second substance, which first substance can be heat transferring substance and second substance can be light storing substance, can be essentially evenly distributed to the casing part like in FIG. 1 or they can be located at certain part of the casing part for example to the bottom or side of the casing part and/or near the light sources. FIG. 2 presents an embodiment where first substance 204, e.g., heat transferring substance 204 is added only to the lower side of the casing part 106, more specifically under the light source and second substance 202, e.g., the light storing substance 202 is added only to the upper side of the casing part 106.

The heat transferring substance is material which is able to transfer the heat away from certain location, preferably from the light sources and also from other components. When the lights of the invention light sources 108 are on and heat is generated, the heat transferring substance transfers the heat away from the light sources.

In one embodiment of the invention light storing substance can be located in such a way to the casing part 106 that it creates a symbol or symbols, e.g. an arrow, exit text or other symbols.

First and second substance can comprise dyes or particles of various sizes which contain certain substance which can enable certain functionality. In case of light storing substance, the light storing substance can be light storing dyes particles of various sizes which contain e.g. phosphor or some other similar substance that stores the light emitted by the light sources within itself. In case of heat transferring substance, heat transferring material can be heat transferring particles of various sizes which contain e.g. carbon, aluminium oxide, ceramics or some other similar substance that has essentially high thermal conductivity. It's also advantageous if heat transferring substance is not electrically conductive.

The light sources 108 of an illuminated stripe 100 can be arranged such that they are directed directly towards the top surface of the illuminated stripe 100, in which case most of the light is guided directly to above the illuminated stripe 100. In this case also some of the light emitted by the light sources 108 is funnelled to the sides of the light sources. In an alternative embodiment the light source can be directed towards a side of the illuminated stripe 100. A number of light sources 108 can also be fitted side-by-side onto an illuminated stripe 100. The light sources 108 can also be of different colours.

In one embodiment of the invention the first substance has differing optical qualities than the second substance. For example the first substance can have diffractive material and second substance can have reflective material. Also for example the first substance may have another color than the second substance.

The light-source band can be formed from light sources placed one after the other, which light sources are arranged e.g. in the manner presented in FIG. 1. The structure of the light-source band can be elastic. A light-source band can be installed e.g. on floors and in rooms that people use when exiting from emergency situations. A light-source band can be installed on the horizontal plane, i.e., as is presented in FIG. 1. A light-source band can also be installed vertically, e.g. between the seams of floor tiles. The stripe according to the invention can be mounted also directly on the wall, in a profile or in handrail or the like.

Figure 3:
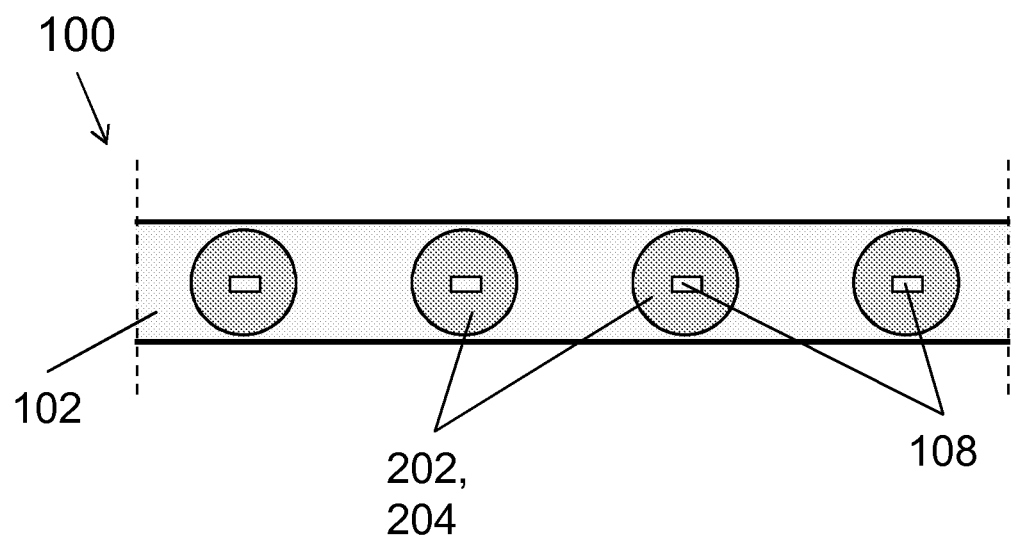
FIG. 3 presents the structure of an example embodiment of illuminated stripe according to the invention which contains first and/or second substance at certain areas of the casing part as viewed from above the illuminated stripe.

FIG. 3 presents an example embodiment of illuminated stripe 100 according to the invention as viewed from above. The illuminated stripe 100 comprises consecutive or adjacent light sources 108 and a circuit board 102. The light sources 108 of the illuminated stripe 100, the circuit board 102 and be fitted inside the casing part 106 which contains first substance 204 e.g. heat transferring substance and second substance 202 e.g. light-storing substance. The first and/or second substance, which substances can be e.g. light-storing and/or heat transferring substances, can be arranged to casing part 106 e.g. only near the light sources 108 and/or other components. When the light of the light sources 108 is on, it illuminates casing part 106 containing a light-storing substance. The area 202, 204 containing heat transferring substance can be smaller or bigger as the areas 202 presented in FIG. 2. If areas comprising heat transferring material are located near, e.g. under, the light sources or other components, e.g. under the light sources or other components, they can effectively transfer heat away from light sources or other components. The areas 202 where heat transferring substance is located are not necessarily visible in reality as in the illustration of FIG. 2.

Figure 4:
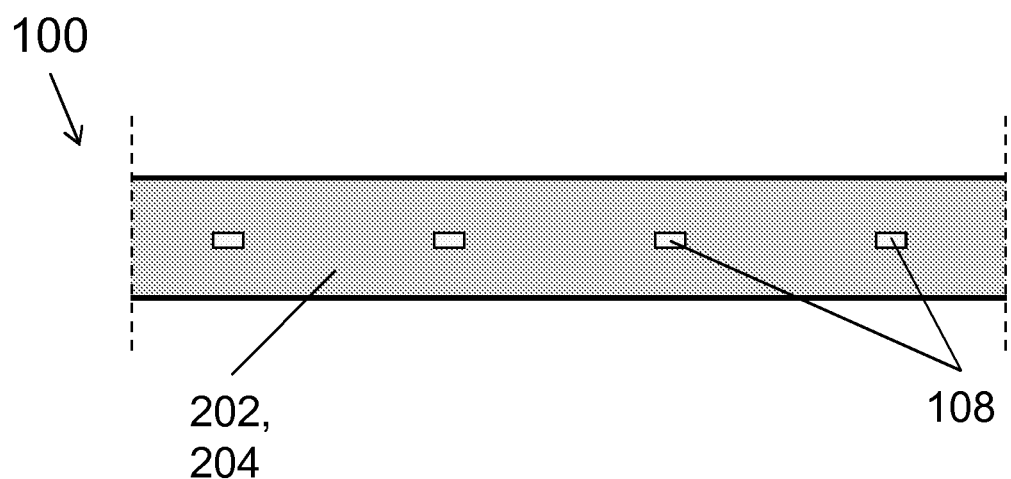
FIG. 4 presents the structure of an example embodiment of illuminated stripe according to the invention which contains first and/or second substance in the whole casing part as viewed from above the illuminated stripe.

FIG. 4 presents one embodiment of illuminated stripe 100 according to the invention as viewed from above. The illuminated stripe 100 comprises consecutive or adjacent light sources 108 and around them is area which contains first substance 204 and/or second substance 202, e.g. heat transferring substance and/or light-storing substance and the whole casing part 106 comprises first and second substances. The substances can be mixed together or they can be located in separate areas and/or layers.

The invention relates also to a method for production of illuminated stripe. In the method of the invention electric components of a illuminated stripe, that enable preferably dynamic use, are being attached preferably by means of surface mounting techniques to an electric conductor layer, such as to a copper coating or like of a basic material, that is made of plastics, such as polyamide, polyester, polyethylene napthalate or like, of the conductor part, that is based on so called printed circuit board techniques, whereby the electric conductor layer continues essentially uninterruptedly over the whole length of the illuminated stripe, whereafter the entirety being brought out is being surrounded by a casing material, that is based on plastics such as PVC, polyurethane, olefin and/or like. First and second substance, e.g. heat transferring substance and light storing material, can be added to casing material before the continuous production process, e.g. extrusion or during the production process. The heat transferring substance can be e.g. heat transferring particles. The heat transferring substance, e.g. particles can be essentially evenly distributed to the casing part or they can be located at certain part of the casing part. The light storing material can be e.g. light storing particles or light storing dye. The light storing material, e.g. particles or dye can be essentially evenly distributed to the casing part or they can be located at certain part of the casing part.

Furthermore as an advantageous embodiment, the electric conductor layer of the illuminated stripe, such as copper coating or like of the conductor part, that is made of a continuous flexible printed circuit board, can be coated at least by the parts surrounding the electric components by a covering color, film or like before processing of the casing material.

Figure 5:
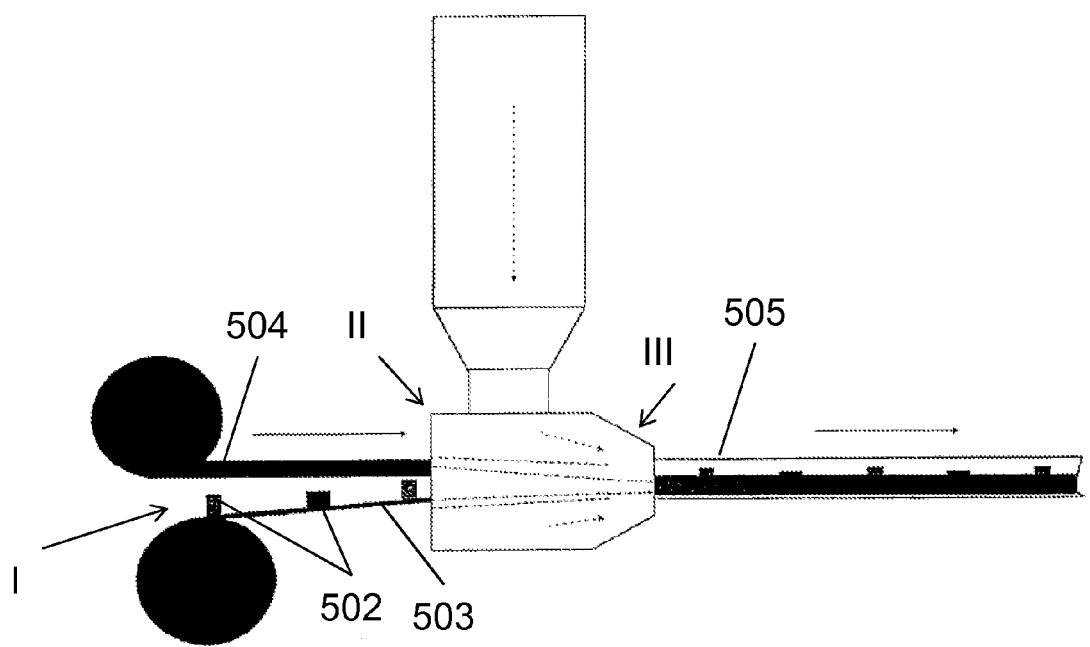
FIG. 5 presents an example embodiment of the production method of the illuminated stripe according to the invention.

FIG. 5 presents an exemplary embodiment of the method of production of the illuminated stripe. The electric components 502 are being attached during a first phase I by surface processing techniques to the flexible conductor part 503, that is preferably unwound from a roll, whereafter at least the covering color 504, stripe or like surrounding at least the electric components of the conductor part can be attached to the same during a second phase II and wherein the same is being extruded during a third phase III by a casing material 505 surrounding the same essentially overall, the casing material 505 forming the casing part. The first and second substance, e.g. heat transferring substance, which can consist of particles of heat transferring substance and light storing material, which can consist of particles or dye of light storing substance, can be added to casing material 505 before the third phase III or during the third phase III. The first and second substance, e.g. light storing material and heat transferring substance, can be added essentially evenly to the casing part 106 or to certain part or parts of the casing part 106. Naturally it is possible to vary the above working stages in other ways also e.g. so that the electric components are being placed not until the covering stripe has been installed.

In one embodiment of the invention the casing part can be formed by extruding at least two different materials, wherein one of the materials contains first substance, e.g. light storing substance and the other one of materials contains second substance, e.g. heat transferring substance. Also third material can be used which doesn't contain particles of heat transferring or light storing material. The materials containing light storing substance can be e.g. polymer which contains light storing substance and heat transferring substance can be e.g. polymer which contains ceramics or other heat transferring substance. The possible third material can be e.g. polymer which doesn't contain light storing substance or heat transferring substance.

In one embodiment of the invention an illuminated stripe 100 can light or extinguish the light sources 108 singly or in groups. An illuminated stripe 100 can e.g. "run" light, i.e. an individual light source 108 can be lit when the adjacent light source 108 extinguishes and is extinguished when the adjacent light source 108 on the same or on the other side lights up. An illuminated stripe 100 can also light and extinguish all the light sources 108 at one time and repeat this function.

Flashing of the illuminated stripe 100 is achieved with this, which flashing can fasten people's attention on the illuminated stripe 100 better than a stripe continuously illuminated with the light sources.

In the embodiment with light storing substance the illuminated stripe 100 or the patterning of the illuminated stripe can be made visible also for a set time after the light sources 108 are extinguished or have extinguished, e.g. owing to an electrical outage by means of the casing part 106 that contains a light-storing substance. The duration of visibility of the illuminated stripe 100 after the extinguishing of the light sources depends on the materials used and the efficiency of the light sources of the illuminated stripe 100. The duration of when an illuminated stripe 100 is visible in the dark can be e.g. approx. 1-2 hours. In one embodiment the light of the light sources is visible also when the casing part contains light storing substance. In another embodiment of the invention, the light sources are not visible but they are illuminating the light storing substance.

According to one embodiment of the invention an illuminated stripe system can be formed by means of one or more illuminated stripes according to the invention, and a control device. By means of the control device of the illuminated stripe system the illuminated stripes of the system or the individual light sources can be controlled. The control device of the system can be disposed in connection with an illuminated stripe or it can be separate from the illuminated stripe or the illuminated stripes operating via a wireline or wireless connection. One control device can control one or more illuminated stripes. A control device can also be connected to just one illuminated stripe, which conducts or conveys control information to the other illuminated stripes of the system. A light-source band, for example, can be used as an illuminated stripe. Power to the stripes and control devices can be supplied from power supplies and/or battery or batteries and/or other types of power supplies.

An illuminated stripe and an illuminated stripe system can have different modes, e.g. static and dynamic modes. In the static mode all the light sources 108 of an illuminated stripe can be on continuously. In the dynamic mode the light sources 108 of an illuminated stripe can be extinguished and lit in a predetermined manner. By extinguishing and lighting the light sources 108, an impression of movement can be brought about. In this case people can be guided with light sources 108 to be lit and extinguished in a predefined manner, e.g. in the direction of travel of the "movement" of the light sources.

Typically the impression of movement is brought about by controlling the light sources 108 in groups, in which movement is indicated by lighting the next light source and correspondingly extinguishing the previous one. All the light sources 108 of a certain illuminated stripe or a number of illuminated stripes can also be lit at one time and extinguished after this. When this function is repeated, flashing of the illuminated stripe is achieved, which can fasten people's attention on the illuminated stripe better than a static mode.

In one embodiment of the invention the system can light or extinguish the individual light sources of an individual illuminated stripe. The light sources can also be lit or extinguished in groups.

The illuminated stripe system can be used e.g. in connection with a traffic control system, an emergency exit control system, an evacuation system or a fire alarm system and the control system of the systems in question can control the control device or illuminated stripes of the illuminated stripe system.

The invention thus relates to an illuminated stripe, which comprises light-emitting light sources 108, means for conducting current to the light sources 108 and a casing part 106, wherein the light sources 108 and/or means for conducting current to the light sources 108 are at least in part surrounded with the casing part 106. At least a part of the casing part 106 comprises first substance, and at least a part of the casing part 106 comprises second substance.

In one embodiment of the invention at least a part of the casing part 106 comprises third substance which doesn't contain first substance and/or second substance.

In one embodiment of the invention the first substance is heat transferring substance, which transfers heat away from the light sources and/or other components.

In one embodiment of the invention the second substance is a light-storing substance, which emits light for at least a certain time after the light sources are not in operation, and the light sources 108 are arranged in connection with the illuminated stripe 100 such that at least a part of the light emitted by the light sources 108 is directed to the casing part 108.

In one embodiment of the invention the heat transferring substance comprises particles of heat transferring material.

In one embodiment of the invention the light storing substance comprises particles of light storing material.

In one embodiment of the invention the particles are located evenly in the casing part 106.

In one embodiment of the invention particles are located at certain part of the casing part 106.

In one embodiment of the invention the light sources 108 are connected to a circuit board 102.

In one embodiment of the invention the light sources 108 are arranged consecutively and/or adjacently.

In one embodiment of the invention the light sources 108 are semiconductor light sources, e.g. LED light sources.

In one embodiment of the invention the circuit board 102 is elastic.

In one embodiment of the invention the casing part 106 of the illuminated stripe 100 is waterproof.

In one embodiment of the invention the heat transferring substance in the casing part 106 is arranged under at least a part of the light sources 108.

In one embodiment of the invention the light-storing substance in the casing part 106 is arranged around at least a part of the light sources 108.

In one embodiment of the invention the heat transferring substance comprises particles which contain carbon, aluminium oxide, ceramics or some other similar substance that has essentially high thermal conductivity.

The invention relates also to an illuminated stripe system, which comprises at least one illuminated stripe and at least one control unit. The illuminated stripe is an illuminated stripe 100 according to the invention and the control unit is configured to control the light sources of the illuminated stripes by lighting and by extinguishing them in a predetermined manner.

In one embodiment of the invention the control unit is configured to light and to extinguish one at a time the light sources of one illuminated stripe 100 in a predetermined manner.

In one embodiment of the invention control information is transmitted to the illuminated stripe 100 wirelessly or by wireline.

In one embodiment of the invention the illuminated stripe system is controlled by a traffic control system, an emergency exit control system, an evacuation system or a fire alarm system.

The invention relates also to a method of production of illuminated stripe, which illuminated stripe comprises means for conducting current in which several light-emitting light sources 108 are being attached to one after another in the longitudinal direction, and of a casing part 106, wherein illuminated stripe is being produced by arranging the light sources 108 and means for conducting current to light sources 108 when viewed in a cross section totally surrounded by a casing material forming the said casing part 106, by exploiting a continuous production process, such as extrusion or like, the light sources 108, that enable preferably dynamic use, are being attached preferably by means of surface processing techniques to the means for conducting current to light sources 108, whereby means for conducting current to light sources 108 continues essentially uninterruptedly over the whole length of the conducting element, wherein the entirety being brought out is being surrounded by a casing material that is based on plastics such as PVC, polyurethane, olefin and/or. In the method first substance is added at least to a part of the casing material, and second substance is added at least to a part of the casing material.

In one embodiment of the invention third substance is added at least to a part of the casing material not containing first and/or second substance. Third substance doesn't contain first substance and/or second substance.

In one embodiment of the invention the first substance is heat transferring substance and the heat transferring substance is arranged such that it transfers heat away from the light sources and/or other components.

In one embodiment of the invention the second substance is light storing substance, and the light sources 108 and light storing substance are arranged in connection with the illuminated stripe 100 such that at least a part of the light emitted by the light sources 108 is directed to the casing part 108 illuminating the light storing substance.

In one embodiment of the invention the casing part 106 is formed by extruding at least two different materials, wherein one of the materials comprises first substance and the other material comprises second substance.

It is obvious to the person skilled in the art that the invention is not limited to the embodiments presented above, but that it can be varied within the scope of the claims presented below. The characteristic features possibly presented in the description in conjunction with other characteristic features can also, if necessary, be used separately to each other.

The invention claimed is:

1. An illuminated stripe, which comprises at least one light-emitting light source means for conducting current to the light sources and a casing part, wherein the light sources and/or means for conducting current to the light sources are at least in part surrounded with the casing part,
   wherein
   at least a part of the casing part comprises a first substance, and
   at least a part of the casing part comprises a second substance and
   wherein the casing part is formed by exploiting a continuous production process.

2. The illuminated stripe according to claim 1 wherein at least a part of the casing part comprises a third substance which does not contain the first substance and/or second substance.

3. The illuminated stripe according to claim 1 wherein the first substance is a heat transferring substance, which transfers heat away from the light sources and/or other components.

4. The illuminated stripe according claim 1 wherein the second substance is a light-storing substance, which emits light for at least a certain time after the light sources are not in operation, and
   the light sources are arranged in connection with the illuminated stripe such that at least a part of the light emitted by the light sources is directed to the casing part.

5. The illuminated stripe according to claim 2, wherein the heat transferring substance comprises particles of heat transferring material.

6. The illuminated stripe according to claim 3, wherein the light storing substance comprises particles of light storing material.

7. The illuminated stripe according to claim 5, wherein the particles are located evenly in the casing part.

8. The illuminated stripe according to claim 5, wherein particles are located at certain part of the casing part.

9. The illuminated stripe according to claim 1, wherein the light sources are connected to a circuit board.

10. The illuminated stripe according to claim 1, wherein the light sources are arranged consecutively and/or adjacently.

11. The illuminated stripe according to claim 1, wherein the light sources are semiconductor light sources, including LED light sources.

12. The illuminated stripe according to claim 9, wherein the circuit board is elastic.

13. The illuminated stripe according to claim 1, wherein the casing part of the illuminated stripe is waterproof.

14. The illuminated stripe according to claim 3, wherein the heat transferring substance in the casing part is arranged under at least a part of the light sources.

15. The illuminated stripe according to claim 4, wherein the light-storing substance in the casing part is arranged around at least a part of the light sources.

16. The illuminated stripe according to claim 3, wherein the heat transferring substance comprises particles which contain carbon, aluminium oxide, ceramics and substances having essentially high thermal conductivity.

17. An illuminated stripe system, which comprises at least one illuminated stripe as defined in claim 1 and at least one control unit,
   said control unit being configured to control the light sources of the illuminated stripes by lighting and by extinguishing the light sources in a predetermined manner.

18. The illuminated stripe system according to claim 17, wherein the control unit is configured to light and to extinguish, one at a time the light sources of one illuminated stripe, in a predetermined manner.

19. The illuminated system according to claim 17, wherein control information is transmitted to the illuminated stripe wirelessly or by a wireline.

20. The illuminated stripe system according to claim 17, wherein the illuminated stripe system is controlled by a traffic control system, an emergency exit control system, an evacuation system and a fire alarm system.

21. A method for the production of an illuminated stripe, said illuminated stripe comprising means for conducting current in which several light-emitting light sources are attached to one another in a longitudinal direction, in a casing part, wherein the illuminated stripe is produced by the following steps:

arranging the light sources and the means for conducting current to the light sources in a casing material, wherein the casing material is formed by a continuous extrusion process over the light sources and the means for conducting current to the light sources, whereby the means for conducting current to the light sources continues essentially uninterruptedly over the entire length of the illuminated stripe, wherein the casing material is a plastic material selected from the group consisting of PVC, polyurethane, and an olefin, wherein:

adding a first substance to at least a part of the casing material, and adding a second substance to at least a part of the casing material.

22. The method for the production of an illuminated stripe according to claim 21 wherein a third substance is added to at least a part of the casing material which does not contain the first and/or second substance, and wherein the third substance is neither the first substance nor the second substance.

23. The method for the production of the illuminated stripe according to claim 21 wherein the first substance is a heat transferring substance which is arranged such that it transfers heat away from the light sources and other components.

24. The method for the production of an illuminated stripe according to claim 21 wherein the second substance is a light storing substance, and the light sources and the light storing substances are arranged in connection with the illuminated stripe such that at least a part of the light emitted by the light sources is directed to the casing part, illuminating the light storing substance.

25. The method for the production of an illuminated stripe according to claim 21 wherein the casing part is formed by extruding at least two different materials, and wherein one of the materials comprises the first substance and the other material comprises the second substance.

* * * * *